(12) United States Patent
Ando

(10) Patent No.: US 10,811,371 B2
(45) Date of Patent: Oct. 20, 2020

(54) SEMICONDUCTOR DEVICE AND MANUFACTURING METHOD THEREOF

(71) Applicant: Mitsubishi Electric Corporation, Tokyo (JP)

(72) Inventor: Naoto Ando, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/218,352

(22) Filed: Dec. 12, 2018

(65) Prior Publication Data

US 2019/0123000 A1   Apr. 25, 2019

Related U.S. Application Data

(62) Division of application No. 15/249,696, filed on Aug. 29, 2016, now abandoned.

(30) Foreign Application Priority Data

Jan. 14, 2016   (JP) ................................ 2016-005382

(51) Int. Cl.
*H01L 21/56*   (2006.01)
*H01L 23/00*   (2006.01)
(Continued)

(52) U.S. Cl.
CPC ........ *H01L 23/564* (2013.01); *H01L 21/4825* (2013.01); *H01L 21/565* (2013.01);
(Continued)

(58) Field of Classification Search
CPC . H01L 23/564; H01L 21/4825; H01L 21/565; H01L 23/3135; H01L 23/3171;
(Continued)

(56) References Cited

U.S. PATENT DOCUMENTS 6,368,899 B1   4/2002   Featherby et al.
7,948,062 B2   5/2011   Makiyama et al.
(Continued)

FOREIGN PATENT DOCUMENTS

CN   102194769 A   9/2011
CN   102649357 A   8/2012
(Continued)

OTHER PUBLICATIONS

An Office Action dated by the Korean Patent Office dated Jun. 12, 2017, which corresponds to Korean Patent Application No. 10-2016-0171262 and is related to U.S. Appl. No. 15/249,696 (and is related to the present application); with English language Concise Explanation.

(Continued)

*Primary Examiner* — Matthew C Landau
*Assistant Examiner* — Dmitriy Yemelyanov
(74) *Attorney, Agent, or Firm* — Studebaker & Brackett PC

(57) ABSTRACT

A semiconductor device includes: a semiconductor substrate; a semiconductor layer on the semiconductor substrate; a source electrode and a drain electrode spaced apart from each other on the semiconductor layer; a gate electrode on the semiconductor layer between the source electrode and the drain electrode; and an insulating film covering the semiconductor layer, the source electrode, the drain electrode and the gate electrode, the gate electrode has an eaves structure including a lower electrode joined to the semiconductor layer and an upper electrode provided on the lower electrode and wider than the lower electrode, a principal ingredient of the insulating film is an oxide film where atomic layers are alternately arrayed for each monolayer, and a film thickness of the insulating film that covers the lower electrode of the gate electrode is equal to a film (Continued)

thickness of the insulating film that covers the upper electrode.

1 Claim, 5 Drawing Sheets

(51) Int. Cl.
  *H01L 23/31* (2006.01)
  *H01L 29/66* (2006.01)
  *H01L 21/48* (2006.01)
  *H01L 23/495* (2006.01)
  *H01L 23/66* (2006.01)
  *H01L 29/40* (2006.01)
  *H01L 29/812* (2006.01)

(52) U.S. Cl.
  CPC ...... *H01L 23/3135* (2013.01); *H01L 23/3171* (2013.01); *H01L 23/4952* (2013.01); *H01L 23/49562* (2013.01); *H01L 23/66* (2013.01); *H01L 29/408* (2013.01); *H01L 29/66848* (2013.01); *H01L 29/66863* (2013.01); *H01L 29/8128* (2013.01); *H01L 24/48* (2013.01); H01L 2223/6683 (2013.01); H01L 2224/48091 (2013.01); H01L 2224/48247 (2013.01); H01L 2924/00014 (2013.01); H01L 2924/1306 (2013.01); H01L 2924/1423 (2013.01)

(58) Field of Classification Search
  CPC ........... H01L 23/4952; H01L 23/49562; H01L 23/66; H01L 29/408; H01L 29/66848; H01L 29/66863; H01L 29/8128; H01L 24/48; H01L 2223/6683; H01L 2224/48091; H01L 2224/48247; H01L 2924/00014; H01L 2924/1306; H01L 2924/1423
  See application file for complete search history.

(56) References Cited

U.S. PATENT DOCUMENTS

| | | | | |
|---|---|---|---|---|
| 2003/0013235 | A1* | 1/2003 | Featherby | H01L 23/293 438/127 |
| 2004/0041258 | A1* | 3/2004 | Song | H01L 23/3128 257/723 |
| 2006/0171152 | A1* | 8/2006 | Suehiro | H01L 33/56 362/363 |
| 2007/0004080 | A1 | 1/2007 | Ouyang | |
| 2007/0007621 | A1 | 1/2007 | Omura et al. | |
| 2008/0185174 | A1 | 8/2008 | Bedinger et al. | |
| 2008/0290372 | A1 | 11/2008 | Makiyama | |
| 2009/0085063 | A1 | 4/2009 | Makiyama et al. | |
| 2009/0166815 | A1 | 7/2009 | Makiyama et al. | |
| 2009/0294779 | A1* | 12/2009 | Ida | H01L 27/14618 257/82 |
| 2010/0219454 | A1 | 9/2010 | Amasuga | |
| 2011/0221046 | A1 | 9/2011 | Xiao | |
| 2012/0021254 | A1 | 1/2012 | Kuboki | |
| 2012/0178226 | A1 | 7/2012 | Makiyama | |
| 2012/0212545 | A1 | 8/2012 | Mizukami et al. | |
| 2013/0209006 | A1* | 8/2013 | Kolev | C23C 16/45546 384/7 |
| 2013/0277680 | A1 | 10/2013 | Green et al. | |
| 2014/0065842 | A1* | 3/2014 | Anthis | H01L 21/0215 438/779 |
| 2015/0069384 | A1 | 3/2015 | Kobayashi et al. | |
| 2015/0144961 | A1 | 5/2015 | Yoon et al. | |

FOREIGN PATENT DOCUMENTS

| | | |
|---|---|---|
| JP | 2003-526920 A | 9/2003 |
| JP | 2009-088097 A | 4/2009 |
| JP | 2010-518627 A | 5/2010 |
| JP | 2015073090 A | 4/2015 |
| JP | 2015-099865 A | 5/2015 |
| KR | 10-2008-0028984 A | 4/2008 |

OTHER PUBLICATIONS

An Office Action issued by the Korean Patent Office dated Dec. 26, 2017, which corresponds to Korean Patent Application No. 10-2016-0171262 and is related to U.S. Appl. No. 15/249,696.

An Office Action mailed by the Japanese Patent Office dated May 14, 2019, which corresponds to Japanese Patent Application No. 2016-005382 and is related to U.S. Appl. No. 16/218,352.

An Office Action mailed by the Japanese Patent Office dated Oct. 8, 2019, which corresponds to Japanese Patent Application No. 2016-005382 and is related to U.S. Appl. No. 16/218,352.

An Office Action mailed by the State Intellectual Property Office of the People's Republic of China dated Nov. 7, 2019, which corresponds to Chinese Patent Application No. CN201710025398.8 and is related to U.S. Appl. No. 16/218,352.

An Office Action mailed by the German Patent and Trade Mark Office dated Nov. 5, 2019, which corresponds to German Patent Application No. DE102017200339.1 and is related to U.S. Appl. No. 16/218,352.

An Office Action mailed by the State Intellectual Property Office of the People's Republic of China dated Jun. 8, 2020, which corresponds to Chinese Patent Application No. 201710025398.8 and is related to U.S. Appl. No. 16/218,352 with English language translation.

* cited by examiner

SEMICONDUCTOR DEVICE AND MANUFACTURING METHOD THEREOF

CROSS-REFERENCE TO RELATED APPLICATIONS

This application is a Divisional Application of U.S. patent application Ser. No. 15/249,696 filed Aug. 29, 2016, which claims benefit of Japanese Patent Application No. 2016-005382, filed on Jan. 14, 2016, the entire contents of which are incorporated herein by reference.

BACKGROUND OF THE INVENTION

Field

The present invention relates to a semiconductor device and a manufacturing method thereof.

Background

There are FET gate electrodes having an eaves structure that includes a lower electrode joined to a semiconductor substrate and an upper electrode wider than the lower electrode. An insulating film that covers the gate electrode having such an eaves structure is conventionally formed using a CVD method. However, since the supply of an insulating film material to the lower part of the eaves decreases, the insulating film that covers the lower electrode becomes thinner than other parts, which reduces a water blocking capability, causing moisture resistance to be more likely to deteriorate. Note that if the gate electrode having the eaves structure is totally embedded with a thick insulating film (e.g., see JP 2015-99865 A), it is possible to prevent the above-described problem with deterioration of moisture resistance.

However, embedding the gate electrode with a thick insulating film to prevent the problem with deterioration of moisture resistance may lead to the problem that the film thickness of the insulating film increases more than necessary, causing the high-frequency characteristic of the FET to deteriorate.

SUMMARY

The present invention has been implemented to solve the above-described problem and it is an object of the present invention to provide a semiconductor device and a manufacturing method thereof capable of preventing deterioration of the moisture resistance and the high-frequency characteristic.

According to the present invention, a semiconductor device includes: a semiconductor substrate; a semiconductor layer on the semiconductor substrate; a source electrode and a drain electrode spaced apart from each other on the semiconductor layer; a gate electrode on the semiconductor layer between the source electrode and the drain electrode; and an insulating film covering the semiconductor layer, the source electrode, the drain electrode and the gate electrode, the gate electrode has an eaves structure including a lower electrode joined to the semiconductor layer and an upper electrode provided on the lower electrode and wider than the lower electrode, a principal ingredient of the insulating film is an oxide film where atomic layers are alternately arrayed for each monolayer, and a film thickness of the insulating film that covers the lower electrode of the gate electrode is equal to a film thickness of the insulating film that covers the upper electrode.

In the present invention, a principal ingredient of the insulating film that covers the gate electrode having an eaves structure is an oxide film where atomic layers are alternately arrayed for each monolayer. Furthermore, the film thickness of the insulating film that covers the lower electrode of the gate electrode is equal to the film thickness of the insulating film that covers the upper electrode. Therefore, deterioration of the moisture resistance and the high-frequency characteristic can be prevented.

Other and further objects, features and advantages of the invention will appear more fully from the following description.

DESCRIPTION OF EMBODIMENTS

A semiconductor device and a manufacturing method thereof according to the embodiments of the present invention will be described with reference to the drawings. The same components will be denoted by the same symbols, and the repeated description thereof may be omitted.

First Embodiment

Figure 1:
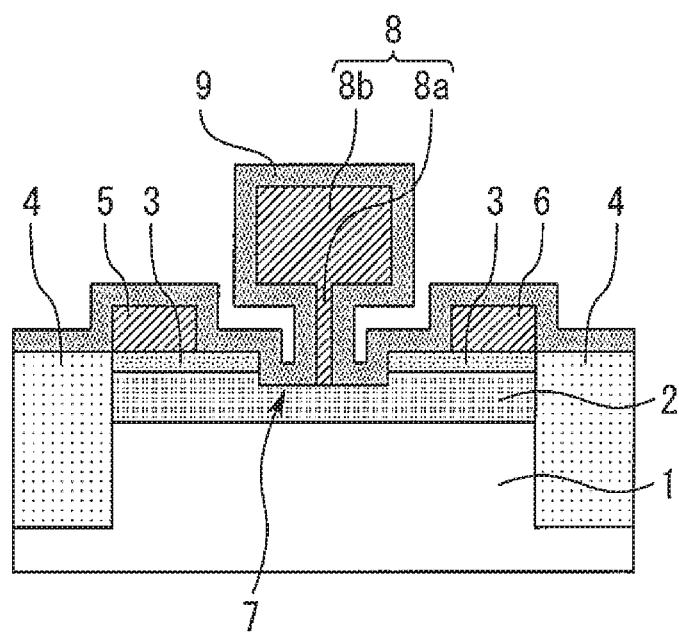
FIG. 1 is a cross-sectional view illustrating a semiconductor device according to a first embodiment of the present invention.

FIG. 1 is a cross-sectional view illustrating a semiconductor device according to a first embodiment of the present invention. A conductive layer 2 and a cap layer 3 are provided on a semiconductor substrate 1. The elements are separated from each other by a nonconductor portion 4. A source electrode 5 and a drain electrode 6 are provided spaced apart from each other on the cap layer 3. The source electrode 5 and the drain electrode 6 are ohmic-joined to the cap layer 3.

Part of the cap layer 3 is removed and a concave portion 7 is formed there. A gate electrode 8 is provided on the conductive layer 2 between the source electrode 5 and the drain electrode 6. An insulating film 9 covers the conductive layer 2, the cap layer 3, the source electrode 5, the drain electrode 6 and the gate electrode 8. The insulating film 9 is in direct contact with at least part of the source electrode 5, the drain electrode 6 and the gate electrode 8.

The gate electrode 8 has an eaves structure including a lower electrode 8a Schottky-joined to the conductive layer 2 on a bottom surface of the concave portion 7 and an upper electrode 8b which is provided on the lower electrode 8a and wider than the lower electrode 8a. The area of a planar shape of the upper electrode 8b is greater than the junction area between the lower electrode 8a and the conductive layer 2. The insulating film 9 has an oxide film where atomic layers are alternately arrayed for each monolayer as a principal ingredient. The film thickness of the insulating film 9 that covers the lower electrode 8a of the gate electrode 8 is equal to the film thickness of the insulating film 9 that covers the upper electrode 8b. Here, cases where both films have the same film thickness include not only a case where the two films are completely the same but also a case where the two films are substantially equal within an error range of ±10%.

Next, a method of manufacturing the semiconductor device according to the present embodiment will be described. FIGS. 2 to 5 are cross-sectional views illustrating the method of manufacturing the semiconductor device according to the first embodiment of the present invention.

Figure 2:
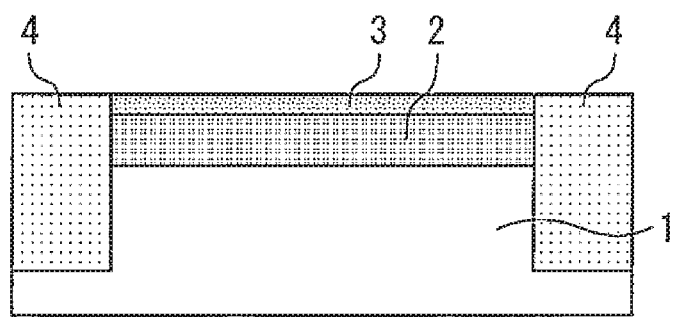
FIGS. 2 to 5 are cross-sectional views illustrating the method of manufacturing the semiconductor device according to the first embodiment of the present invention.

First, as shown in FIG. 2, the conductive layer 2 and the cap layer 3 are formed on the semiconductor substrate 1 using an epitaxial growth method. By injecting, for example, hydrogen ions after covering only a region where the FET is intended to be formed with a resist or the like, the nonconductor portion 4 is formed and the elements are separated apart from each other.

Figure 3:
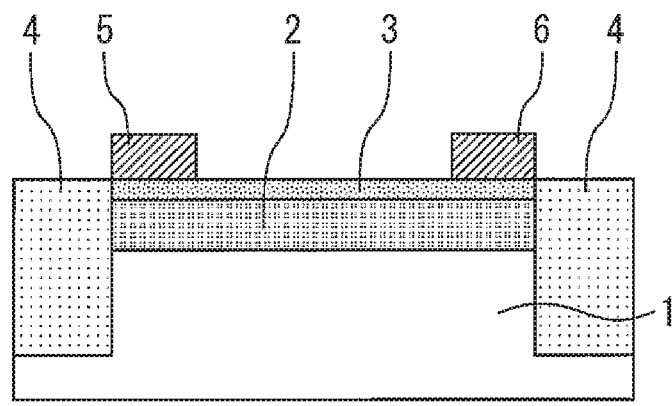

Next, as shown in FIG. 3, the source electrode 5 and the drain electrode 6 are formed on the cap layer 3 using, for example, a vapor deposition lift-off method.

Figure 4:
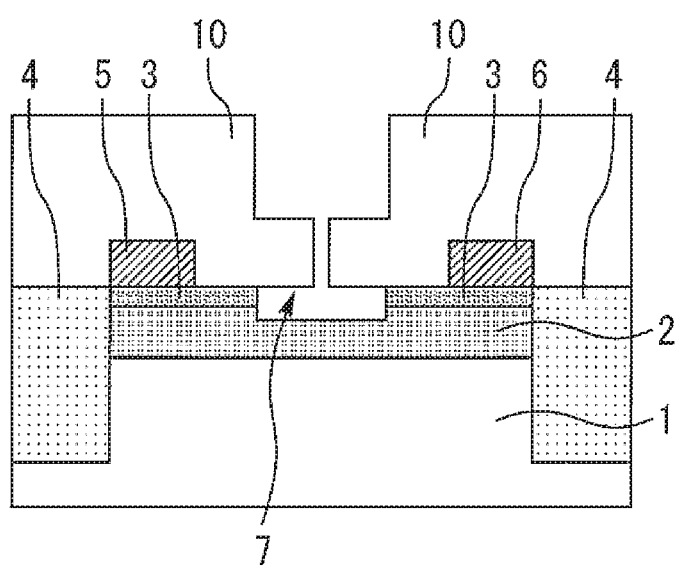

Next, as shown in FIG. 4, a gate generating resist 10 for forming an eaves structure is formed. The concave portion 7 is formed by etching the conductive layer 2 and the cap layer 3 with, for example, phosphoric acid so that a desired amount of current is obtained.

Figure 5:
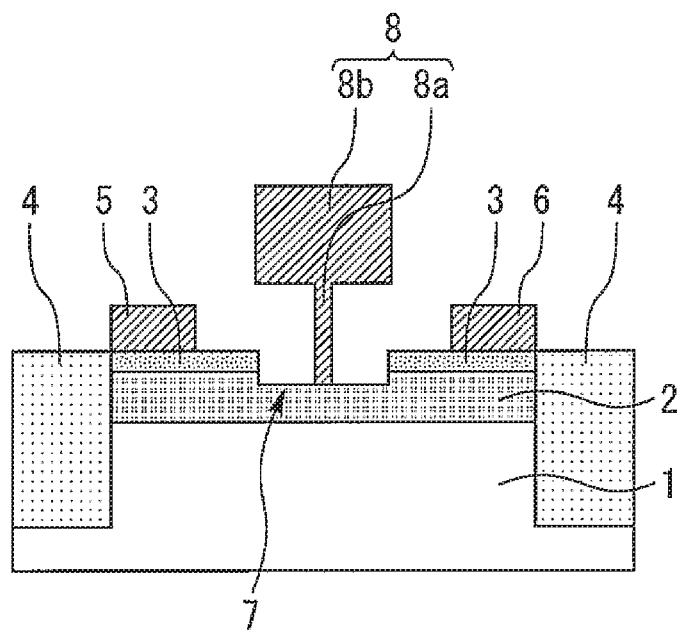

Next, as shown in FIG. 5, the gate electrode 8 having an eaves structure is formed using, for example, a vapor deposition lift-off method. Next, as shown in FIG. 1, the insulating film 9 that covers the conductive layer 2, the cap layer 3, the source electrode 5, the drain electrode 6 and the gate electrode 8 is formed. Here, the insulating film 9 is formed using a method of laminating films of molecules of raw material compound by repeating steps of film formation through surface adsorption and reaction and removal of surplus molecules through purging for each monolayer, such as ALD (atomic layer deposition). After that, the respective elements are connected by wiring and a protective film to cover them is formed, and the semiconductor device is thus manufactured.

Figure 6:
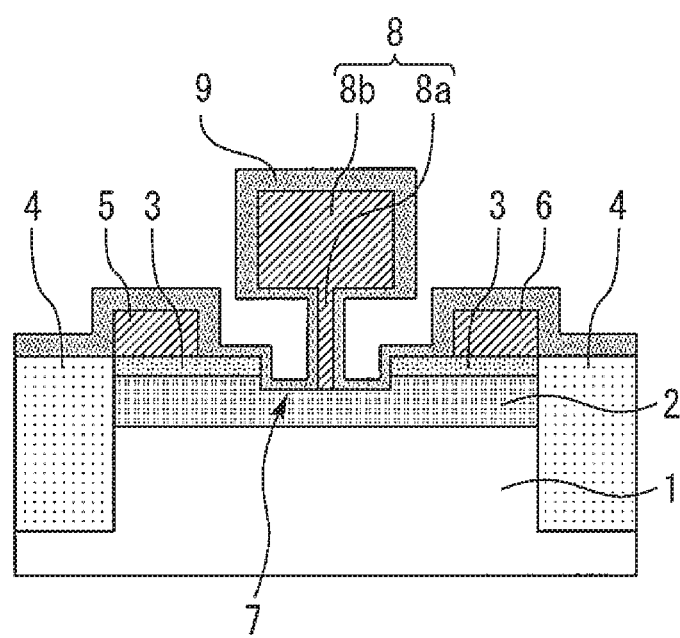
FIG. 6 is a cross-sectional view illustrating a semiconductor device according to a comparative example.

Next, effects of the present embodiment will be described in comparison with a comparative example. FIG. 6 is a cross-sectional view illustrating a semiconductor device according to a comparative example. In the comparative example, an insulating film 9 that covers the gate electrode 8 having an eaves structure is formed using a CVD method. However, since the interval between the eaves of the gate electrode 8 and a bottom surface of the concave portion 7 is narrow and the supply of the insulating film material decreases, the insulating film 9 that covers the lower electrode 8a becomes thinner than other parts. Therefore, its water blocking capability decreases, causing moisture resistance to be more likely to deteriorate.

In contrast, the present embodiment forms the insulating film 9 that covers the gate electrode 8 having an eaves structure using a method of laminating films of molecules of raw material compound by repeating steps of film formation through surface adsorption and reaction and removal of surplus molecules through purging for each monolayer, such as ALD. That is, a principal ingredient of the insulating film 9 is an oxide film where atomic layers are alternately arrayed for each monolayer. It is thereby possible to make the film thickness of the insulating film 9 that covers the lower electrode 8a of the gate electrode 8 equal to the film thickness of the insulating film 9 that covers the upper electrode 8b. Therefore, it is possible to prevent a decrease in moisture resistance due to an insufficient film thickness. Moreover, since the film thickness of the insulating film 9 need not be increased more than necessary to prevent a decrease in moisture resistance, it is also possible to prevent deterioration of the high frequency characteristic.

The insulating film 9 is an insulating film whose principal ingredient is a Ta oxide film. Without being limited to this, however, the insulating film 9 may also be an insulating film whose principal ingredient is a Si oxide film or an insulating film whose principal ingredient is a layered structure of a Ta oxide film and a Si oxide film. Using the layered structure of a Ta oxide film and a Si oxide film in particular can improve the reliability and the high-frequency characteristic of the semiconductor device more than their respective single layer structures.

Second Embodiment

Figure 7:
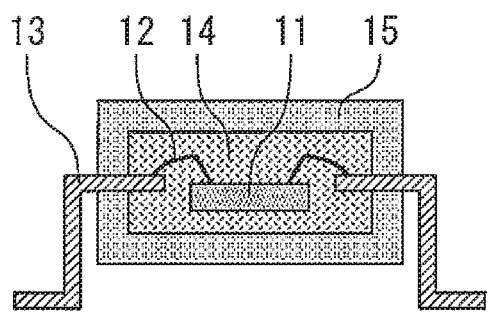
FIG. 7 is a cross-sectional view illustrating a semiconductor device according to a second embodiment of the present invention.
Figure 8:
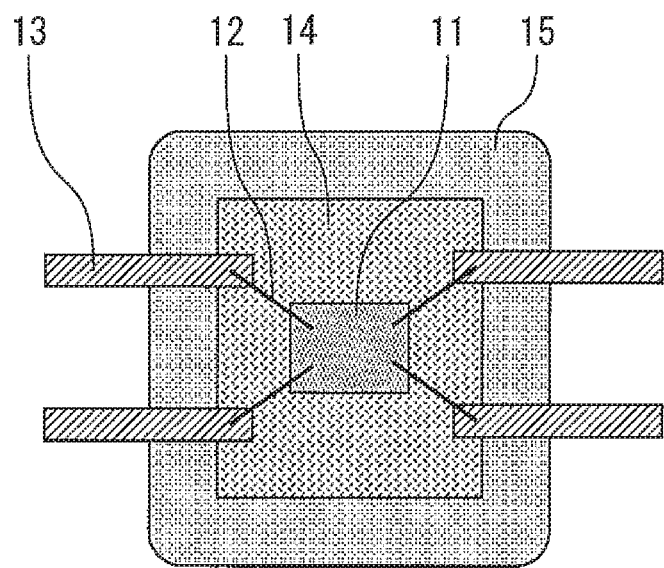
FIG. 8 is a plan view illustrating an interior of the semiconductor device according to the second embodiment of the present invention.
Figure 9:
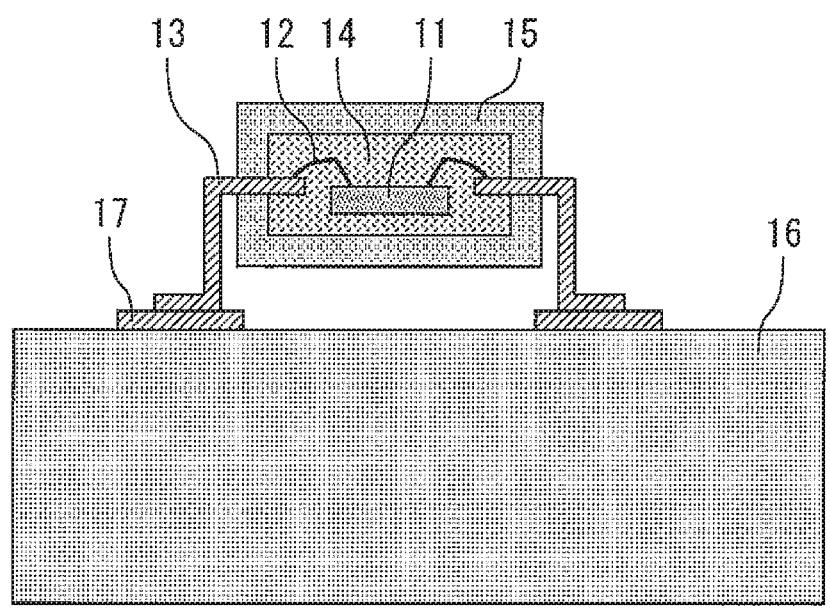
FIG. 9 is a cross-sectional view illustrating the semiconductor device in FIG. 7 mounted on a mounting substrate.

FIG. 7 is a cross-sectional view illustrating a semiconductor device according to a second embodiment of the present invention. FIG. 8 is a plan view illustrating an interior of the semiconductor device according to the second embodiment of the present invention. FIG. 9 is a cross-sectional view illustrating the semiconductor device in FIG. 7 mounted on a mounting substrate.

A semiconductor chip 11 is, for example, a transistor and a wiring structure provided on a semiconductor substrate. The semiconductor chip 11 is connected to leads 13 via wires 12. Parts of the semiconductor chip 11, the wires 12 and the leads 13 are covered with mold resin or the like, and a package 14 in which the semiconductor chip 11 is mounted is formed. An insulating film 15 covers the entire package 14. The package 14 is mounted on a mounting substrate 16. In this case, the leads 13 are joined to electrodes 17 on the mounting substrate 16.

The insulating film 15 is formed using a method of laminating films of molecules of raw material compound by repeating steps of film formation through surface adsorption and reaction and removal of surplus molecules through purging for each monolayer, such as ALD. That is, a film whose principal ingredient is an oxide film on which atomic layers are alternately arrayed for each monolayer is used as the insulating film 15.

Although the package 14 mounted with the semiconductor chip 11 includes a large difference in height, the insulating film 15 of the present embodiment can cover all exposed portions of the package 14 with a film of uniform thickness. Therefore, it is possible to prevent deterioration of moisture resistance of an FET or MMIC in the package 14 due to the high difference in height and insufficient film thickness in the rear portion.

Furthermore, the insulating film 15 is an insulating film whose principal ingredient is a Ta oxide film. Without being limited to this, however, the insulating film 15 may also be an insulating film whose principal ingredient is a Si oxide film or the insulating film 15 may be an insulating film whose principal ingredient is a layered structure of a Ta oxide film and a Si oxide film.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-005382, filed on Jan. 14, 2016 including specification, claims, drawings and summary, on which the Convention priority of the present application is based, is incorporated herein by reference in its entirety.

The invention claimed is:

1. A semiconductor device comprising:
   a semiconductor chip;
   a package in which the semiconductor chip is mounted; and
   an insulating film covering all exposed portions of the package,
   wherein a principal ingredient of the insulating film is an oxide film where atomic layers are alternately arrayed for each monolayer, and
   the principal ingredient of the insulating film is a layered structure of a Ta oxide film and a Si oxide film.

* * * * *